(12) United States Patent
Yamashita et al.

(10) Patent No.: US 6,700,182 B2
(45) Date of Patent: Mar. 2, 2004

(54) THERMALLY CONDUCTIVE SUBSTRATE, THERMALLY CONDUCTIVE SUBSTRATE MANUFACTURING METHOD AND POWER MODULE

(75) Inventors: Yoshihisa Yamashita, Kyoto (JP); Koichi Hirano, Hirakata (JP); Seiichi Nakatani, Hirakata (JP); Mitsuhiro Matsuo, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 121 days.

(21) Appl. No.: 09/870,684

(22) Filed: Jun. 1, 2001

(65) Prior Publication Data

US 2002/0020897 A1 Feb. 21, 2002

(30) Foreign Application Priority Data

Jun. 1, 2000 (JP) ..................................... P2000-164225

(51) Int. Cl.[7] ............................................. H01L 23/495
(52) U.S. Cl. ...................... 257/666; 257/669; 257/668; 257/678; 257/690; 257/692; 257/698; 257/699; 257/700; 257/702

(58) Field of Search ................................ 257/699, 723, 257/724, 725, 666, 668, 669, 690, 692, 698, 678, 700, 702

(56) References Cited

U.S. PATENT DOCUMENTS

| | | | |
|---|---|---|---|
| 6,201,696 B1 | * | 3/2001 | Shimizu et al. ............. 361/704 |
| 6,291,880 B1 | * | 9/2001 | Ogawa et al. ............... 257/723 |
| 6,366,443 B1 | * | 4/2002 | Devoe et al. ................ 361/313 |

* cited by examiner

Primary Examiner—Nathan J. Flynn
Assistant Examiner—Fazli Erdem
(74) Attorney, Agent, or Firm—Morrison & Foerster LLP

(57) ABSTRACT

By providing an end portion of a radiation plate located on and near an end portion of an insulator sheet, to which a lead frame extends, at a position away from the end portion of the insulator sheet inside of the insulator sheet in a plane direction of the insulator sheet, it is possible to secure a creeping distance between the lead frame and the radiation plate without decreasing a lead frame area on which components can be actually mounted.

10 Claims, 9 Drawing Sheets

F I G. 3
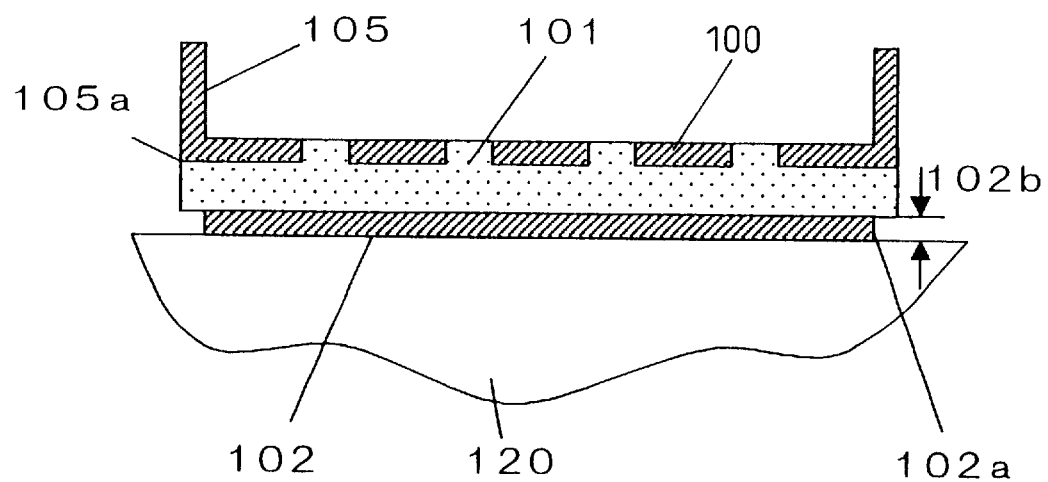

F I G. 4 A
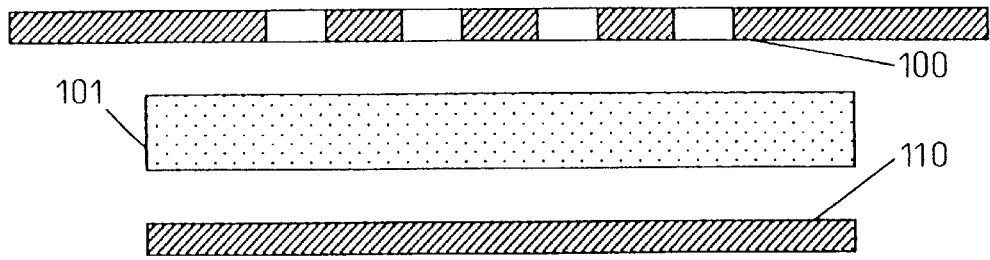
F I G. 4 B
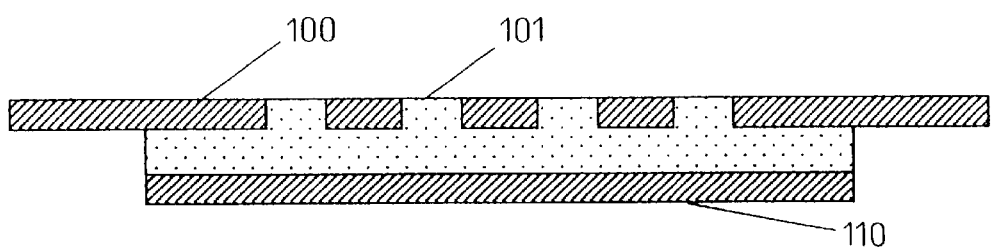
F I G. 4 C
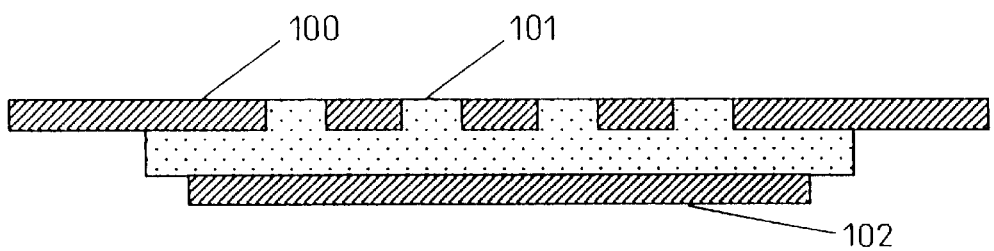

F I G. 5 A
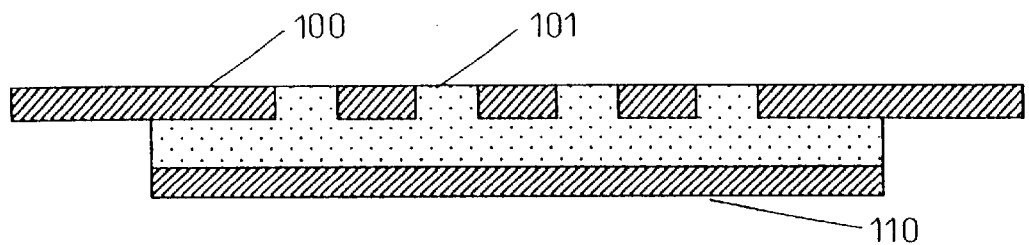
F I G. 5 B
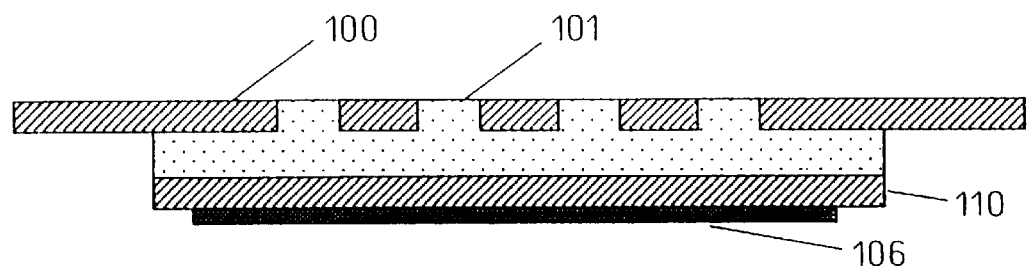
F I G. 5 C
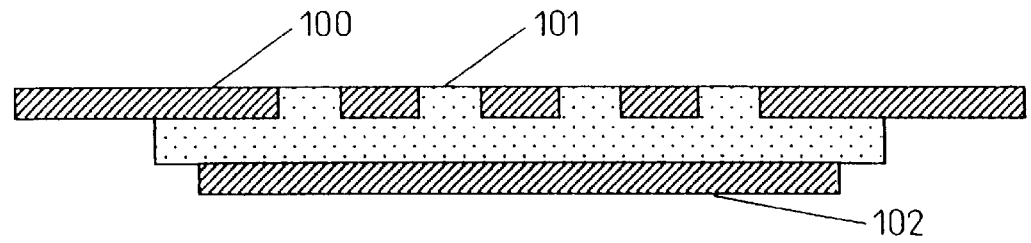

THERMALLY CONDUCTIVE SUBSTRATE, THERMALLY CONDUCTIVE SUBSTRATE MANUFACTURING METHOD AND POWER MODULE

BACKGROUND OF THE INVENTION

1. Field of the Invention

The present invention relates to a circuit substrate or particularly relates to a thermally conductive substrate employed for packaging power electronics, a manufacturing method therefor and a power module incorporating a thermally conductive substrate.

2. Description of the Related Art

In recent years, following improvement in the performance of electronic equipment and demand for miniaturization, it is desired to increase the density of a semiconductor and to improve the function thereof. Due to this, circuit substrates for packaging semiconductors are also desired to be small in size and high in density. As a result, design in which radiation of the circuit substrate is taken into consideration becomes important.

As circuit substrates exhibiting good radiating property, various types of circuit substrates have been developed conventionally. It is not, however, easy to maintain a circuit substrate to have good radiating property while holding down the price thereof.

As thermally conductive substrates to solve such disadvantages, there is conventionally known one disclosed by U.S. Pat. No. 6,060,150. The thermally conductive substrate disclosed therein is constituted by forming an insulator sheet having a sufficient thermally conductive filler to increase radiating property, lead frame and a radiation plate integrally with one another.

This substrate is manufactured as follows. A film is formed by mixing thermosetting resin having flexibility in an unhardened state with a thermally conductive filler (or an inorganic filler) to thereby produce an insulator sheet filled with the inorganic filler at high concentration for a thermally conductive substrate. Then, the insulator sheet, the lead frame and the radiation plate are built up with the insulator sheet put between the lead frame and the radiation sheet and the resultant buildup layers are heated and pressurized. As a result, the insulator sheet flows in the surfaces of the lead frame and hardened, thereby integrating the lead frame and the insulator sheet with each other. Further, the radiation plate adheres to the surface of the insulator sheet opposite to the surface to which the lead frame adheres.

Here, for the purpose of stabilizing the shapes of the lead frame and facilitating a processing for integrating the lead frame with the insulator sheet, all the end portions of the lead frame are coupled to a frame-shaped common outer peripheral portion. Due to this, the outside residues and outer peripheral portion of the lead frame on the thermally conductive substrate thus manufactured are removed except for the necessary parts of inside of the lead frame.

FIG. 13 shows the thermally conductive substrate thus manufactured. In case of the thermally conductive substrate shown in FIG. 13, the lead frame 800 protruding to the side surfaces of the thermally conductive substrate are bent perpendicularly (or in a direction orthogonal to substrate surface) so as to use the tip ends of the lead frame 800 as external lead electrodes.

The thermally conductive substrate stated above has disadvantages in that discharge tends to occur between the lead frame 800 and the radiation plate 802, thereby disadvantageously causing the damage of the substrate. The reason is as follows. To maintain the good thermal conductivity of the thermally conductive substrate, it is necessary to thin the insulator sheet 801. If so, however, the lead frame 800 and the radiation plate 802 become excessively adjacent each other and the creeping distance between the radiation plate 802 and the lead frame 800 cannot be sufficiently secured.

To prevent such a discharge phenomenon, it is proposed to secure a large creeping distance by locating the bent portions 800a of the lead frame 800 at a positions slightly inside of the end faces of the insulator sheet 801 in the sheet plane direction.

If so, however, the lead frame 800 is bent inside compared with the end faces of the substrate, with the result that a region on the thermally conductive substrate in which components can be actually mounted becomes small relatively to the substrate size.

Further, to bend the lead frame 800 toward the inside of the sheet plane of the insulator sheet 801 relatively to the end faces of the sheet 801, the lead frame 800 is required to be peeled off from the insulator sheet 801. This may probably damage the thermally conductive substrate.

To avoid such damage, it is proposed take the following measures. By providing steps on the insulator sheet 801 on portions (i.e., sheet end portions) of the sheet 801 on which the lead frame 800 is pulled out, the step portions of the lead frame 800 is exposed. By doing so, it is possible to prevent the thermally conductive substrate from being damaged without the need to peel off the bent portions 800a of the lead frame 800 from the insulator sheet 801.

To provide such steps on the insulator sheet 801, however, there is no avoiding making the shape of a metallic mold used to manufacture the substrate complex, which hampers cost reduction.

SUMMARY OF THE INVENTION

The main object of the present invention is, therefore, to provide a thermally conductive substrate and a manufacturing method thereof capable of securing a creeping distance between a lead frame and a radiation plate, locating the bent portions of the lead frame on the end faces of an insulator and thereby making the substrate small in size.

To obtain the above object, a thermally conductive substrate according to the present invention is characterized that a lead frame is provided on one surface of an insulator sheet and a radiation plate is provide on the other surface of the insulator sheet; a part of the lead frame extends to an end portion of the insulator sheet; and an end portion of the radiation plate located on and near the end portion of the insulator sheet to which the lead frame extends, is provided at a position away from the end portion of the insulator sheet inside of the insulator sheet in a plane direction of the insulator sheet. It is, therefore, possible to sufficiently secure a creeping distance from the lead frame to the radiation plate on the end portion of the insulator sheet to which the lead frame extends.

It is preferable that the end portion of the radiation plate away from the end portion of the insulator sheet inside of the insulator sheet in the plane direction of the insulator sheet is provided over an entire periphery of the radiation plate. By doing so, it is possible to secure the creeping distance and to manufacture the thermally conductive substrate relatively easily without complicating the structure of the radiation plate.

It is also preferable that a clearance between the end portion of the radiation plate located on and near the end portion of the insulator sheet, to which the lead frame extends, and the end portion of the insulator sheet is set to fall within a range of one to four times as large as a thickness of the insulator sheet. By so setting, it is possible to sufficiently secure the creeping distance and to prevent dielectric breakdown on the creeping surface of the substrate even if a high voltage is applied to the substrate.

It is further preferable that the radiation plate is arranged to be embedded in the insulator sheet while a surface of the radiation plate is exposed from the insulator sheet. By doing so, the end portion of the radiation plate along the thickness direction of the radiation plate is partly or entirely (i.e., the side surface of the radiation plate is) covered with the insulator sheet over the entire periphery of the radiation plate, whereby it is possible to further ensure preventing the dielectric breakdown of the thermally conductive substrate.

Furthermore, it is preferable that continuous steps along a direction crossing a shortest direction between the radiation plate and the lead frame are provided on the end portion of the insulator sheet, the end portion of the radiation plate arranged to be away from the end portion of the insulator sheet. By doing so, it is possible to further extend the creeping distance because of irregularities formed by the steps on the end portion of the insulator sheet.

Also, it is preferable that the insulator sheet contains an inorganic filler. If so, the radiation effect of the thermally conductive substrate is further improved.

Moreover, it is preferable that at least a part of a region along a side surface of the radiation plate in a thickness direction of the radiation plate is exposed from the insulator sheet over an entire periphery of the radiation plate and that an external radiation structure is plane-bonded to an outer surface of the radiation plate. By doing so, it is possible to sufficiently secure the creeping distance between the external radiation structure and the lead frame.

The thermally conductive substrate of the present invention can be manufactured by a method comprising a step of building up the lead frame on the one surface of the insulator sheet, building up the radiation plate on the other surface of the insulator sheet over an entire surface of the insulation sheet, and bonding the lead frame, the radiation plate and the insulator sheet to one another; and a step of removing an end portion of the radiation plate located on and near an end portion of the insulator sheet, to which the lead frame extends, up to a position away from the end portion of the insulator sheet inside of the insulator sheet in a plane direction of the insulator sheet. Here, the end portion of the radiation plate can be removed by cutting the end portion or by a photolithography step. In addition, a radiation plate having a split groove along a peripheral edge of a to-be-removed radiation plate region can be prepared as the radiation plate; and after the radiation plate is bonded to the insulator sheet, the to-be-removed radiation plate region can be divided from other radiation plate regions and removed along the split groove. In this case, it is possible to remove the end portion of the radiation plate relatively easily and surely.

Furthermore, another example of a method of manufacturing the thermally conductive substrate of the present invention may comprise the step of preparing, as the radiation plate, a case-added radiation plate, an end portion of the radiation plate corresponding to and near the end portion of the insulator sheet, to which the lead frame extends, being removed in advance, a case surrounding an entire periphery of the radiation plate being arranged outside of the radiation plate, and building up the lead frame on the one surface of the insulator sheet and the case-added radiation plate on the other surface of the radiation plate to bond the lead frame, the insulator sheet and the case-added radiation plate to one another; and removing the case from the insulator sheet.

Additionally, a power module according to the present invention comprises a thermally conductive substrate, an electronic component, a casing and sealing resin, characterized in that the thermally conductive substrate is constituted such that a lead frame is provided on one surface of an insulator sheet and a radiation plate is provide on the other surface of the insulator sheet, that a part of the lead frame extends to an end portion of the insulator sheet, and that an end portion of the radiation plate located on and near the end portion of the insulator sheet to which the lead frame extends, is provided at a position away from the end portion of the insulator sheet inside of the insulator sheet in a plane direction of the insulator sheet; the electronic component is packaged on one surface of the thermally conductive substrate; the casing is arranged to cover the thermally conductive substrate on which the electronic component is packaged; and the sealing resin is filled in an internal space of the casing and seals the internal space. By doing so, it is possible to sufficiently ensure the creeping distance from the lead frame to the radiation plate on the end portion of the insulator sheet to which the lead frame extends.

BRIEF DESCRIPTION OF THE DRAWINGS

The other objects of the present invention will become apparent by the understanding of embodiments to be described hereinafter and will be evidenced by claims attached hereto. Numerous advantages not mentioned in the present specification will readily occur to those skilled in the art by carrying out these embodiments.

FIG. 3 is a cross-sectional view showing a state in which a heat sink is attached to the thermally conductive substrate of the present invention;

FIG. 4 is a cross-sectional view showing the steps of a manufacturing method for the first preferred embodiment in the order of steps;

FIG. 5 is a cross-sectional view showing respective steps of another manufacturing method for the first preferred embodiment in the order of steps;

DETAILED DESCRIPTION OF THE INVENTION

The preferred embodiments of the present invention will be described hereinafter with reference to the drawings.

Figure 1:
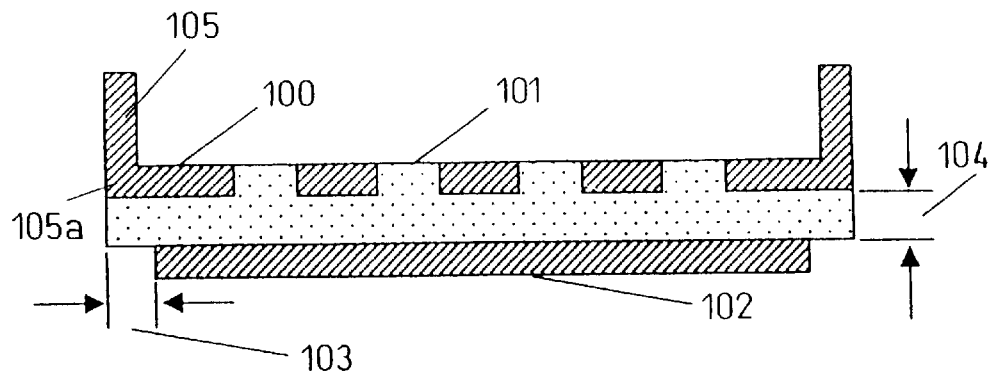
FIG. 1 is a cross-sectional view showing the constitution of a thermally conductive substrate in the first preferred embodiment according to the present invention.
Figure 2:
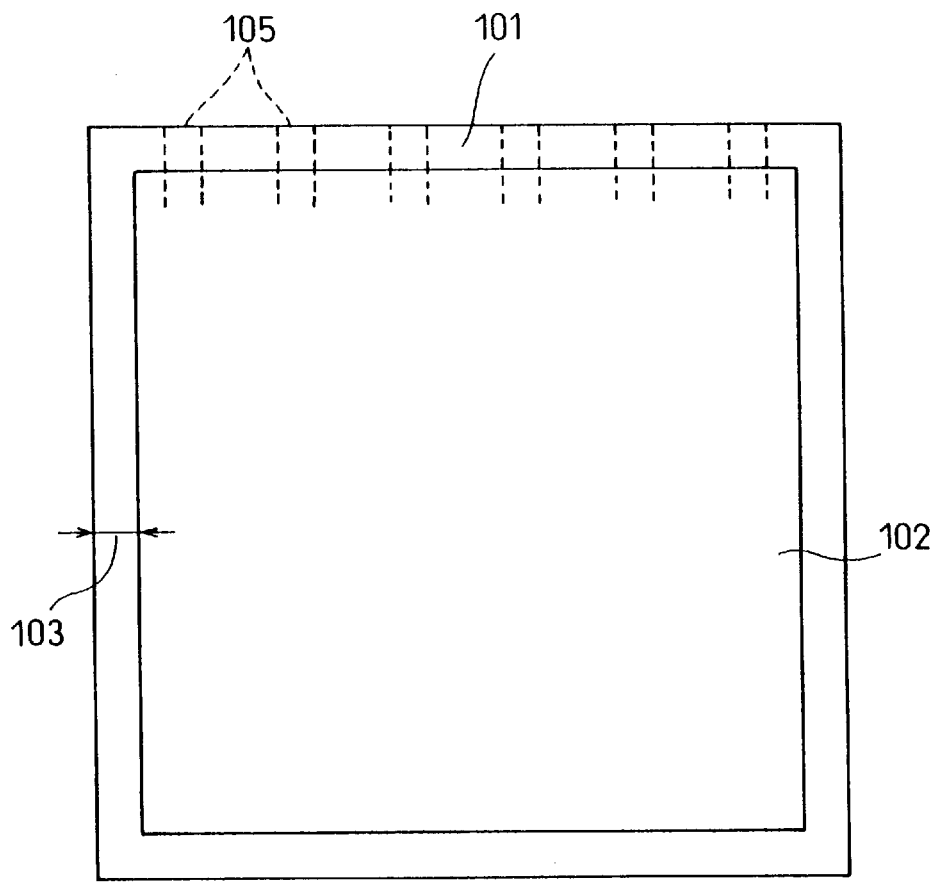
FIG. 2 is a rear view of FIG. 1.

FIG. 1 shows the constitution of a thermally conductive substrate in the first preferred embodiment according to the present invention. FIG. 2 is a rear view of FIG. 1.

The thermally conductive substrate is constituted such that lead frame 100 is bonded to one surface of an insulator sheet 101, containing thermosetting resin and an inorganic filler, and a radiation plate 102 such as a metallic plate is bonded to the other surface of the insulator sheet 101. The lead frame 100 is embedded in the sheet 101 in a state in which only the surface of the lead frame 100 is exposed. The radiation plate 102 is bonded to the other surface of the sheet 101 in a state in which the plate 102 is not embedded in the sheet 101 but mounted thereon. A part of the lead frame 100 protrude outward from the end portions of the sheet 101. The protrusion end serves as an external lead electrode 105. The electrode 105 is bent to be away from the radiation plate 102 along the direction orthogonal to the sheet plane of the sheet on the end portions of the sheet 101. In FIG. 1, reference symbol 105a denotes the bent portion of the electrode 105 (or lead frame 100).

Next, the characteristic constitution of this thermally conductive substrate will be described. The thermally conductive substrate is characterized by the constitution of the radiation plate 102. The radiation plate 102 is constituted to have a slightly smaller plane area than that of the rear surface of the sheet 101. The radiation plate 102 is arranged on the sheet 101 so that the end portions of the radiation plate 102 are located inside of the sheet compared with the sheet end portions over the entire periphery of the sheet 101. Thus, each end portion of the radiation plate 102 is arranged inside of the sheet while keeping a clearance 103 from the corresponding end portion of the sheet 101 over the entire periphery of the radiation plate.

With the above-stated constitution, a creeping distance which is the sum of the thickness 104 of the sheet 101 and the above-stated clearance 103 is formed between the bent portion 105a and the radiation plate 102, thereby ensuring the prevention of discharge between the lead frame 100 and the radiation plate 102.

With the constitution of the thermally conductive substrate of the present invention stated above, it is not necessary to change the constitution of the lead frame 100. Namely, even if the bent portions 105a are located on the end faces of the sheet 101, it is possible to secure a sufficient creeping distance. Accordingly, it is possible to set an electronic component mounting region while making the best use of the actual area of the thermally conductive substrate.

Furthermore, with the constitution of the present invention, there is no need to move the bent portions 105a toward the inside of the insulator sheet 101 so as to secure the creeping distance. If the bent portions 105a are arranged inside of the sheet 101, the insulator sheet 101 may be possibly damaged at the time of forming the bent portions 105a. To prevent such damage, a stepped structure may be provided on each end portion of the insulator sheet 101. If so, however, the structure of a metallic mold used to manufacture the substrate becomes complex and cost is thereby disadvantageously pushed up. With the constitution of the present invention, by contrast, there is no need to provide a stepped structure and it is possible to simplify the structure of a metallic mold accordingly and to thereby reduce cost.

FIG. 3 shows a state in which the thermally conductive substrate of the present invention is attached to a heat sink 120 which is an external radiation structure. In this constitution, at least a part of a region 102b along the thickness direction of the radiation plate 102 on each side surface 102a of the radiation plate 102 is exposed from the insulator sheet 101 over the entire periphery of the side surface 102a for the following reason.

If the heat sink 120 made of a conductor such as metal is provided, discharge generated on the lead frame 100 occurs not only between the lead frame 100 and the radiation plate 102 but also between the lead frame 100 and the heat sink 120. Due to this, it is necessary to set the creeping distance between the heat sink 120 and the lead frame 100 to such a length as not to cause discharge therebetween.

In that case, if the entirety of the region 102b of the radiation plate 102 is covered with the insulator sheet 101 over the entire periphery of the side surface 102a, the heat sink 120 bonded to the radiation plate 102 is plane-bonded to the outer surface of the insulator sheet 101. If so, the heat sink 120 gets proximal to the lead frame 100, making it impossible to keep a sufficient creeping distance therebetween.

On the other hand, if at least a part of the region 102b is exposed from the insulator sheet 101 over the entire periphery of the side surface 102a, the heat sink 120 bonded to the radiation plate 102 turns into a state in which the heat sink 120 is separated from the outer surface of the insulator sheet 101. As a result, the following regions are interposed between the heat sink 120 and the lead frame 100. Externally exposed regions on the side surfaces of the insulator sheet 101, on a part of the outer surface of the insulator sheet 101 and on the side surfaces 102a of the radiation plate 102 are interposed between the heat sink 120 and the lead frame 100. Because of the presence of the respective regions, it is possible to keep a sufficient creeping distance between the heat sink 120 and the lead frame 100. That is why at least a part of each region 102b is exposed from the insulator sheet 101 over the entire periphery of the side surface.

In FIG. 3, the entirety of the region 102b is exposed from the insulator sheet 101 over the entire periphery of the side surface 102a. Needless to say, a part of the region 102b may be exposed from the insulator sheet 101 over the side surface 102a.

FIGS. 4A to 4C are cross-sectional views showing a method of manufacturing this thermally conductive substrate in the order of steps. As shown in FIG. 4A, a lead frame 100, an insulator sheet 101 and a radiation plate original 110 are superposed on one another. It is assumed that the radiation plate original 110 has a plane size equal to or larger than that of the sheet 101. As the sheet 101, an insulator sheet obtained by processing an insulator, which contains at least an inorganic filler and thermosetting resin in an unhardened state, into a sheet is employed. The thermosetting resin contained in the sheet 101 consists of at least one type out of epoxy resin, phenol resin and cyanate resin. These resins are excellent in electrically insulating property and mechanical strength.

Also, the inorganic filler consists of powder of at least one type selected from $Al_2O_3$, MgO, BN and AlN. These fillers are excellent in thermal conductivity. The quantity of the added inorganic filler is preferably about 70 to 95 wt % in the entire sheet 101. In case of a thermally conductive substrate required to have good thermal conductivity, it is preferable to fill 90 wt % or more of the inorganic filler into the sheet 101.

As shown in FIG. 4B, the lead frame 100, the sheet 101 and the radiation plate original 110 are heated and pressurized and the thermosetting resin contained in the sheet 101 is hardened, thereby bonding the lead frame 100 and the radiation plate original 110 to the both surfaces of the sheet 101, respectively. At this moment, the sheet 101 is filled into the surface of the lead frame 100. The heating and pressurizing step is preferably divided into a step of filling the sheet 101 into the surface of the lead frame 100 by heating and pressurizing the lead frame 100, the sheet 101 and the radiation plate original 110 at a temperature at which the thermosetting resin is not hardened and a step of further heating the lead frame 100, the sheet 101 and the radiation plate original 110 and thereby hardening the thermosetting resin. By so dividing, it is possible to fill the sheet 101 to the cavities of the lead frame 100 and harden the sheet 100 separately from each other and to ensure filling and hardening.

Further, as shown in FIG. 4C, the peripheral portion of the radiation plate original 110 is cut and a radiation plate 102 having end faces away from the inside of the sheet compared with the sheet 101 is formed. This cutting processing can be carried out by a router or laser.

As a result, the creeping distance from the lead frame 100 to the radiation plate 102 can be extended. This thermally conductive substrate can, therefore, maintain sufficient reliability against dielectric breakdown even when a high voltage is applied to the substrate.

At this moment, the distance between an end face of the radiation plate 102 and an end face of the sheet 101 bonded to each other is preferably one time or more as large as the thickness of the sheet 101. As the distance is longer, the creeping distance becomes longer, too. However, considering that if the distance is not less than four times as large as the thickness of the sheet 101, radiation from the radiation plate 102 is hampered, the distance is preferably one to four times as large as the thickness of the sheet 101.

FIGS. 5A to 5C are cross-sectional views showing another method of manufacturing the thermally conductive substrate in this embodiment in the order of steps. FIG. 5A shows the prototype of the thermally conductive substrate obtained by superposing the lead frame 100, the insulator sheet 101 and the radiation plate original 110 on one another and heating and pressurizing them to thereby bond them to one another. For the prototype of the thermally conductive substrate thus made, an etching resist film 106 is formed on the radiation plate original 110 as shown in FIG. 5B. The film 106 is formed on the region of the radiation plate 102 to be finally formed (or the central region of the radiation plate original 110).

After forming the film 106, the end portions of the radiation plate original which are not covered with the film 106 are removed by chemical etching. The film 106 is then removed. As a result, a radiation plate 102 formed inside of the sheet compared with the end portions of the sheet 101 is formed over the entire periphery of the radiation plate 102 as shown in FIG. 5C.

To form the film 106, a method of performing ultraviolet exposure using a dry film resist, hardening the resist and then forming the film 106, a method of screen-printing a resist paste, drying the paste and then forming the film 106 or the like can be adopted. With these methods, many thermally conductive substrates can be processed at once.

Figure 6A:
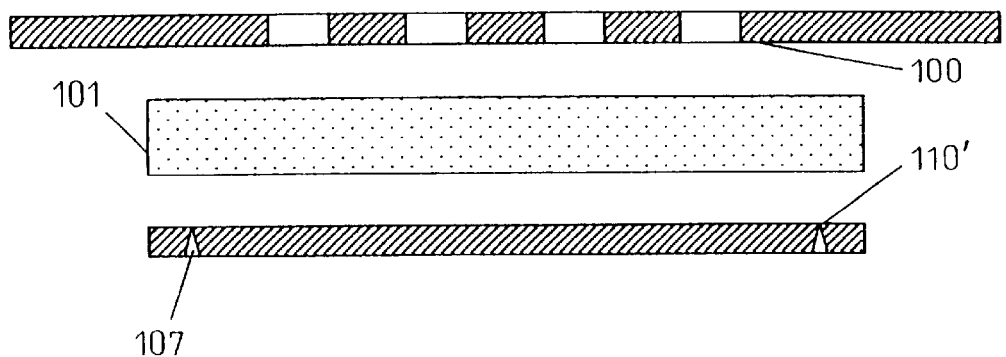
FIG. 6 is a cross-sectional view showing the steps of yet another manufacturing method f or the first preferred embodiment in the order of steps.
Figure 6B:
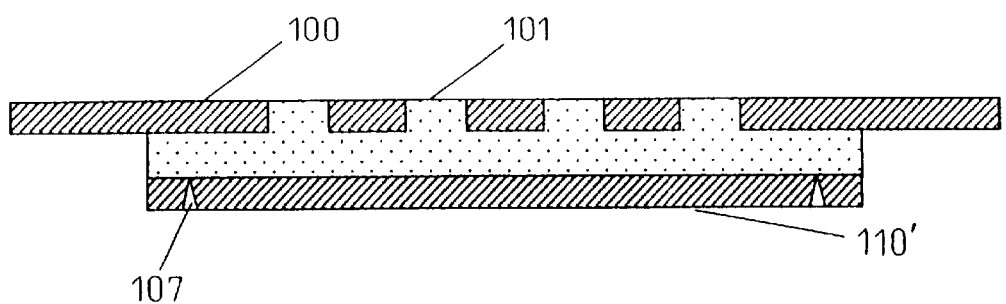
Figure 6C:
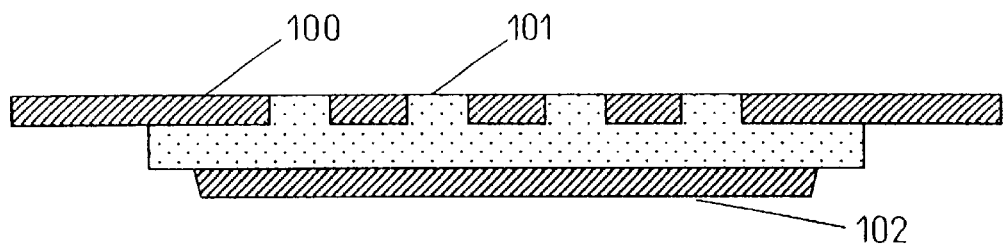

FIGS. 6A to 6C are cross-sectional views showing yet another method of manufacturing the thermally conductive substrate in this embodiment in the order of steps.

As shown in FIG. 6A, a radiation plate original 110' is prepared. The radiation plate original 110' has split grooves 107 along plate end portions at positions each away from the plate end portion by a clearance 103. The groove 107 is formed in the radiation plate original 110' by a rotary blade processing or laser processing.

Thereafter, as shown in FIG. 6B, by superposing the radiation plate original 110', the lead frame 100 and the insulator sheet 101 on one another and heating and pressurizing them, the radiation plate original 110', the lead frame 100 and the insulator sheet 101 are bonded to one another to thereby form the prototype of the thermally conductive substrate. Then, as shown in FIG. 6C, the peripheral regions of the radiation plate original 110' are divided and removed along the respective grooves 107. As a result, over the entire periphery of the sheet 101, the radiation plate 102 having end portions arranged inside of the sheet 101 compared with the end portions of the sheet 101 is formed. With this method, even if there is a large region to be removed from the radiation plate original 110', it is possible to ensure removing the to-be-removed regions in a short time.

Figure 7A:
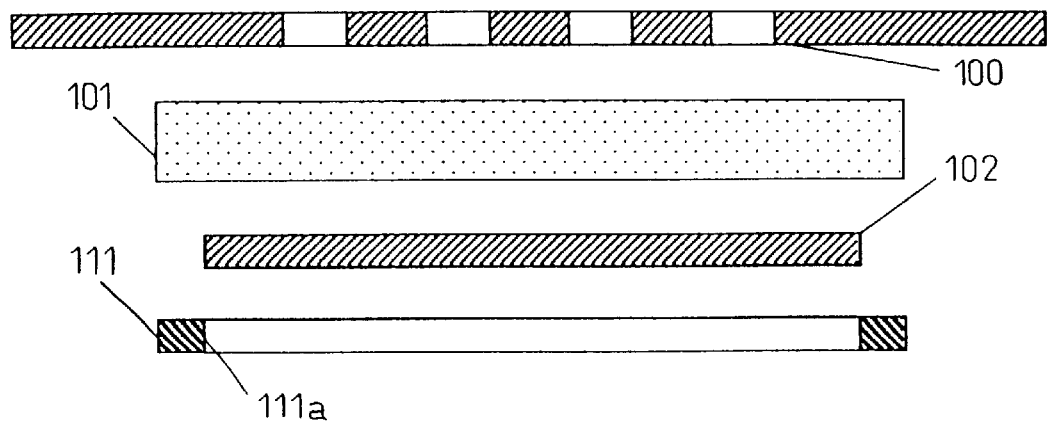
FIG. 7 is a cross-sectional view showing the steps of yet another manufacturing method f or the first preferred embodiment in the order of steps.
Figure 7B:
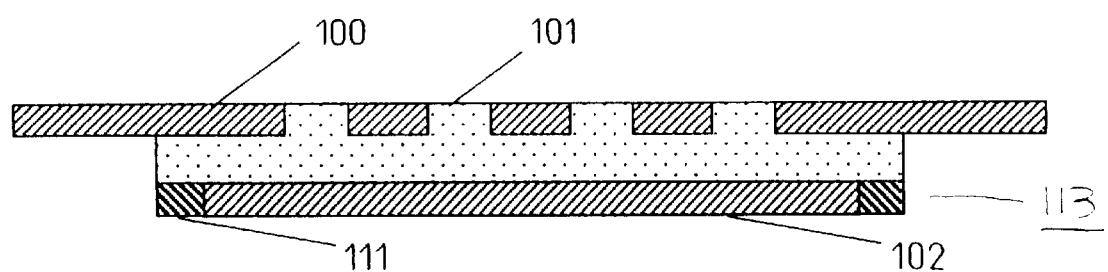
Figure 7C:
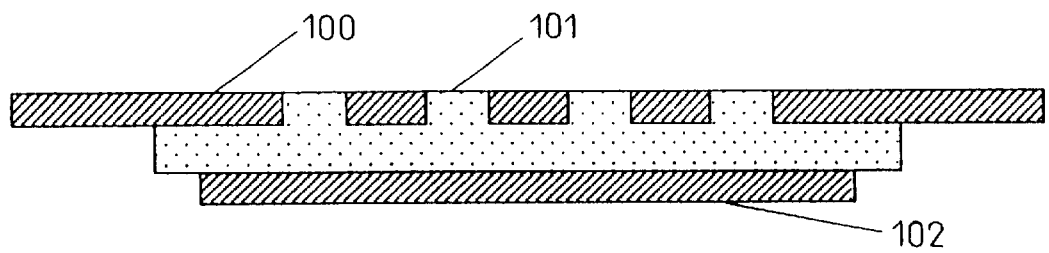

FIGS. 7A to 7C are cross-sectional views showing yet another method of manufacturing the thermally conductive substrate in this embodiment in the order of steps.

As shown in FIG. 7A, a case 111 is prepared. The case 111 has a thickness equal or similar to that of the radiation plate 102 and has an opening portion 111a which is equal in shape to the radiation plate 102 to be finally formed (or slightly smaller in shape than the insulator sheet 101). The radiation plate 102 is fitted into this case 111 and a combination member 113 which is a radiation plate combined with a case is formed. The combination member 113, the lead frame 100 and the insulator sheet 101 are superposed on one another. At this moment, the combination member 113 is positioned relatively to the sheet 101 so that the position of the radiation plate 102 coincides with the position of the sheet 101 on which the radiation plate 102 is finally bonded to the sheet 101.

After superposing the combination member 113, the lead frame 100 and the sheet 101 on one another, they are pressurized and bonded to one another. Then, as shown in FIG. 7C, only the case 111 is removed from the combination member 113, thereby providing a structure in which the end portions of the radiation plate 102 are located inside of the sheet 101 over the entire periphery of the sheet 101. With this method, it is possible to simplify the step of removing the end portions of the radiation plate 102.

Figure 8:
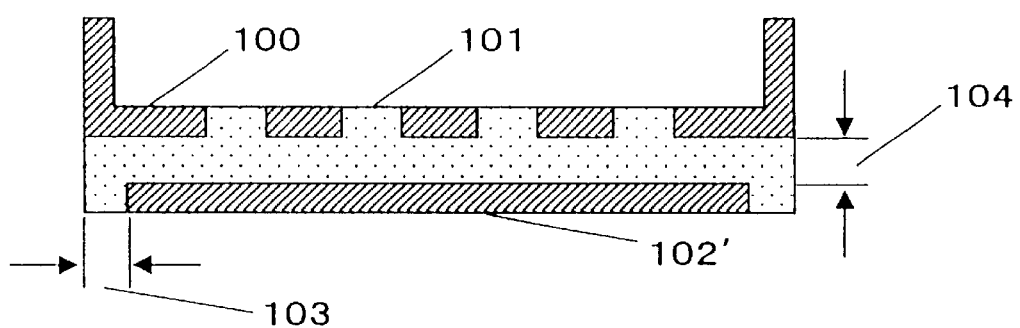
FIG. 8 is a cross-sectional view showing the constitution of a thermally conductive substrate in the second preferred embodiment according to the present invention.

In the embodiments described above, the radiation plate 102 is provided while being mounted on the insulator sheet 102 without embedding a part of the radiation plate 102 into the insulator sheet 101. Alternatively, as shown in FIG. 8, a radiation plate 102' may be embedded into the insulator sheet 101 partly or entirely in the thickness direction of the plate 102' (in which case the surface of the radiation plate 102' is exposed).

A method of manufacturing this thermally conductive substrate will be described with reference to FIGS. 9A and 9B.

Figure 9A:
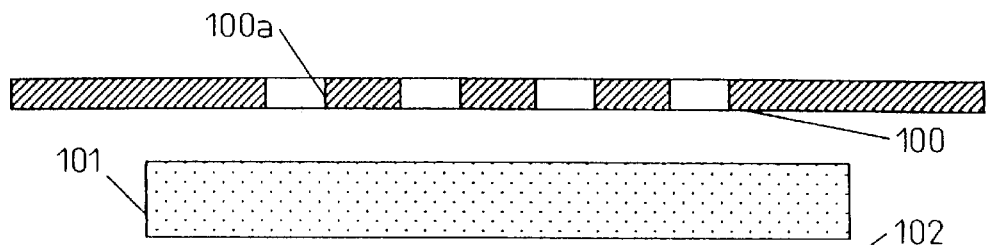
FIG. 9 is a cross-sectional view showing the steps of another manufacturing method for the second preferred embodiment in the order of steps.

As shown in FIG. 9A, the lead frame 100, the insulator sheet 101 and the radiation plate 102 are superposed on one another. Here, the radiation plate 102 is made to have the outline shape of a radiation plate 1021 to be finally formed (slightly smaller than the outline shape of the insulator sheet 101).

The lead frame 100, the sheet 101 and the radiation plate 102 are arranged to be superposed on one another. At this moment, the radiation plate 102 is positioned relatively to the sheet 101 so that the position of the radiation plate 102 coincides with the position of the sheet 101 on which the radiation plate 102 is finally bonded to the sheet 101.

Figure 9B:
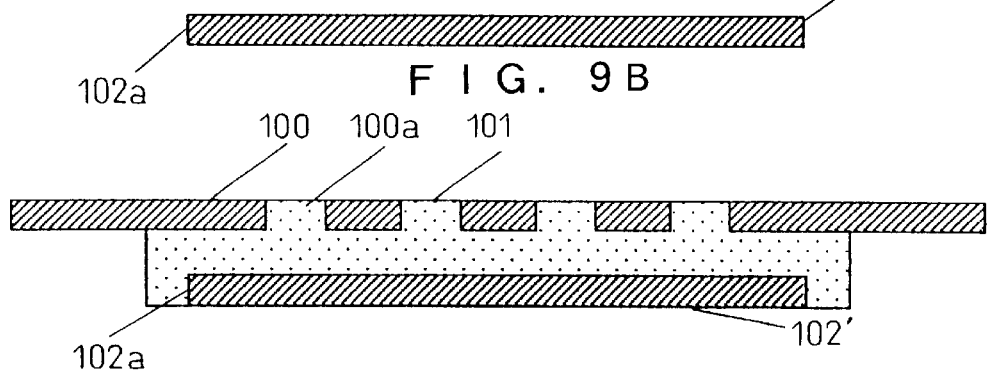

As shown in FIG. 9B, the lead frame 100, the sheet 101 and the radiation plate 102 are heated and pressurized. By doing so, thermosetting region contained in the sheet 101 is hardened and the lead frame 100 and the radiation plate 102 are bonded to the both surfaces of the sheet 101, respectively. At this moment, the sheet 101 is pressurized and heated to such an extent that the internal gaps 100a of the lead frame 100 and the side surfaces 102a of the radiation plate 102 are closed by the sheet 101. The radiation plate 102 in a state in which the side surfaces 102a are closed by the sheet 100 is denoted by reference symbol 102' in FIG. 9B.

At this moment, if the heating and pressurization step is divided into a step of filling the internal gaps 100a and the side surfaces 102a with the insulator sheet 101 while heating and pressurizing the lead frame 100, the sheet 101 and the radiation plate 102 at a temperature at which the thermosetting resin is not hardened, and a step of further heating the lead frame 100, the sheet 101 and the radiation plate 102 and thereby hardening the thermosetting resin, then the filling and the hardening of the sheet 101 are carried out separately and it is possible to ensure carrying out the filling and hardening.

As a result, a part or all of the radiation plate 102' along the thickness direction of the side surfaces 102a thereof are covered with the sheet 101 over the entire periphery of the radiation plate 102'. If so, even if a high voltage is applied to the thermally conductive substrate, it is possible to maintain sufficient reliability against dielectric breakdown. In FIGS. 8 and 9, the entire side surfaces 102a of the radiation plate 102' is covered with the insulator sheet 101. The present invention should not be limited to such a shape. That is, a part of the region of the radiation plate 102 along the thickness direction of the side surfaces 102a thereof maybe covered with the insulator sheet 101. In the latter case, however, it is necessary to provide the region of the side surfaces 102a covered with the insulator sheet 101 over the entire periphery of the radiation plate 102'.

Meanwhile, to farther extend the creeping distance between the lead frame 100 and the radiation plate 102 on the thermally conductive substrate of the present invention, continuous steps may be provided on the end portions of the insulator sheet 101 in the direction in which the continuous steps cross the shortest direction between the radiation plate 102 and the lead frame 100. The steps may be groove-like steps 112 as shown in FIG. 10.

Figure 10:
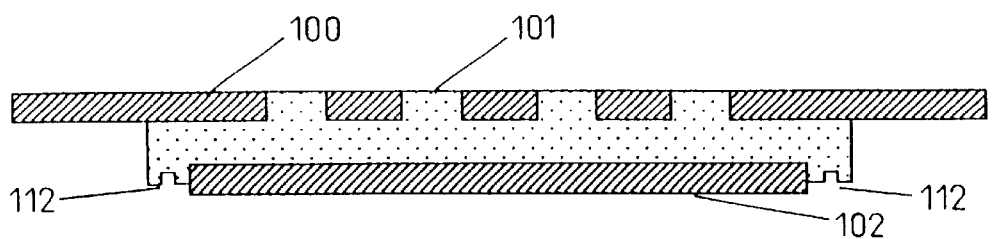
FIG. 10 is a cross-sectional view showing the first modification of the present invention.

In FIG. 10, the steps 112 are provided on the radiation structure in which the radiation plate 102 is embedded in the middle of the thickness of the insulator sheet 101. Needles to say, such steps 112 may be applied to the structure of the thermally conductive substrate in which the radiation plate 102 is mounted on the insulator sheet 101 shown in FIG. 1 or the like. The steps 112 can be provided on the side surfaces of the insulator sheet 101.

Figure 11:
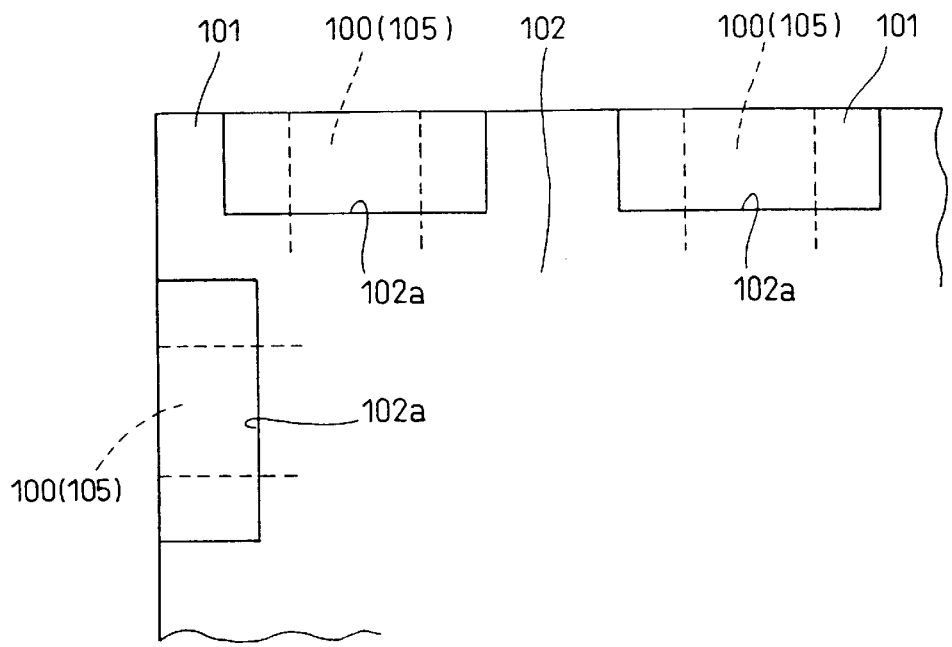
FIG. 11 is a cross-sectional view showing the second modification of the present invention.

Further, in the above-stated embodiments, the end portions of the radiation plate 102 are arranged to be away from the respective end portions of the insulator sheet 101 and to be close to the inside of the sheet. The present invention should not be limited to such arrangement but arrangement as shown in FIG. 11 may be applied to the present invention. That is, the end portions 102a of the radiation plate 102 located on or in the vicinity of the respective end portions of the sheet 101 from which the lead frame 100 (or external lead electrode 105) extends, are selectively separated from the end portions of the sheet 101 inside of the sheet 101 in the plane direction thereof. On the other hand, the other end portions of the radiation plate 102 are provided on the end portions of the sheet 101. It goes without saying that a sufficient creeping distance can be secured even with such arrangement.

Figure 12:
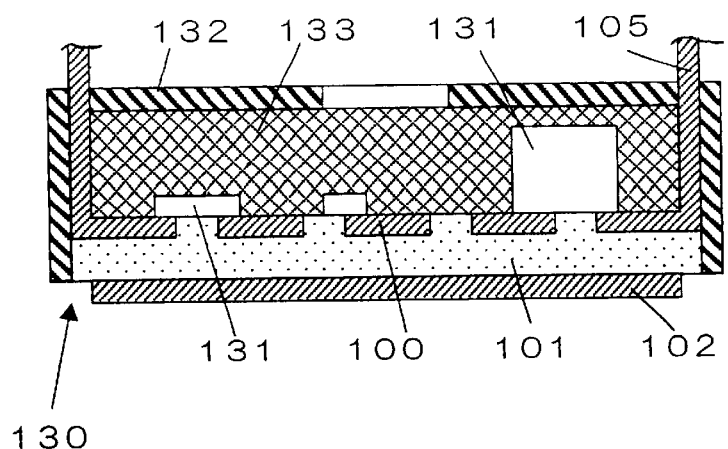
FIG. 12 is a cross-sectional view showing the constitution of a power module incorporating the thermally conductive substrate of the present invention.
Figure 13:
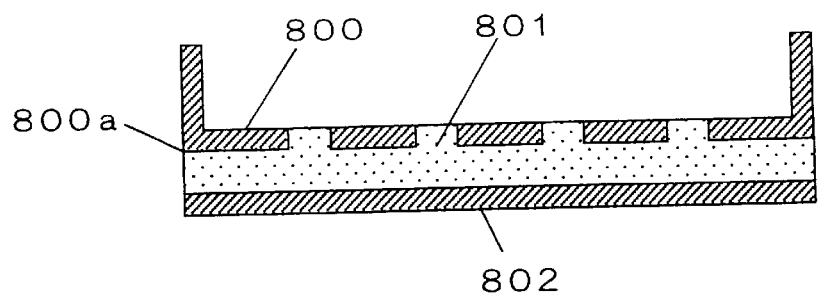
FIG. 13 is a cross-sectional view showing the constitution of a conventional thermally conductive substrate.

FIG. 12 is a cross-sectional view showing the constitution of a power module manufactured using the thermally conductive substrate of the present invention. This power module comprises the thermally conductive substrate 130 of the present invention, electronic components 131, a casing 132 and sealing resin 133. The electronic components 131 are a power semiconductor, a transformer, a choke coil and the like and packaged on the surface of the lead frame 100 on which the radiation plate 102 is not provided. The casing 132 is arranged to cover the electronic component packaging surface of the lead frame 100. The external lead electrodes 105 of the lead frame 100 penetrate the casing 132 and extendexternally. The sealing resin 133 is filled in the internal space of the casing 132 so as to seal the electronic components 131.

Now, the present invention will be described in more detail with reference to more concrete embodiments.
(First Embodiment)
In the manufacture of the thermally conductive substrate in this embodiment, first, a method of producing an insulator sheet 101 made of an inorganic filler and thermosetting resin in an unhardened state will be described.

First, the production of a slurry will be described. An inorganic filler, thermosetting resin in a semi-hardened state, an appropriate solvent and the like were mixed with one another to provide a slurry by an agitating and kneading machine. This agitating and kneading machine revolved a container while the container rotated about its own axis and ensures obtaining a sufficient defoaming function and a sufficient dispersion state even if the viscosity of the resin to be kneaded is relatively high.

Concrete materials are as follows. $Al_2O_3$ ("AS-40" (name used in trade) manufactured by SHOWA DENKO K.K.) was employed as the inorganic filler. A mixture of epoxy resin ("NRV-1010" (name used in trade) manufactured by Japan Rec Co., Ltd.), butyl carbitol and methyl ethyl ketone for regulating viscosity was used as the thermosetting resin. The composition ratios of the respective components were as follows: 90 wt % of inorganic filler, 9.5 wt % of epoxy resin and 0.5 wt % of butyl carbitol.

Next, a separation type film which surface was subjected to a separation treatment by silicon and which had a thickness of 75 $\mu$m (to be specific, polyethylene terephthalate film) was prepared. A film of the above-stated slurry was formed on the separation type film by a doctor blade method. The thickness (or gap) of the film formation sheet was set at about 750 $\mu$m.

Next, this film formation sheet was left and dried at a temperature of 125° C. for 15 minutes, thereby obtaining insulator sheet 101 having appropriate viscosity in an unhardened state (with a thickness of 400 $\mu$m). The methyl ethyl ketone was volatized by this drying treatment.

On the other hand, the lead frame 100 and the radiation plate 102 were prepared. The lead frame 100 was formed by processing a copper plate having a thickness of 500 $\mu$m by an etching method and further conducting nickel plating. The radiation plate 102 consists of an aluminum metallic plate having a thickness of 500 $\mu$m. The (three) insulator sheets 101, the lead frame 100 and the radiation plate 102 were superposed on one another and then heated and radiated at a temperature of 150° C. and pressure of 50 Kg/CM².

By the heating and pressurization treatment, the insulator sheet 101 flowed in the gaps of the lead frame 100 and the prototype structure of the thermally conductive substrate shown in FIG. 3B was formed. Then, the insulator sheet 101 was heated at a temperature of 175° C. for three hours by a dryer to thereby completely harden thermosetting resin contained in the insulator sheet 101.

Next, the end portions of the radiation plate 102 was cut by a router, thereby locating the end portions of the radiation plate 102 inside of the insulator sheet 102 over the entire periphery of the end portions of the insulator sheet 102. Further, the outermost peripheral portions of the lead frame 100 ware cut. The lead frame 100 protruding from the sheet 101 was bent perpendicularly, thereby using the tip ends of the lead frame 100 as external lead electrodes 105. As a result, the thermally conductive substrate shown in FIG. 1 was obtained. It is assumed that the thickness 104 of the insulator sheet 101 right under the lead frame of this thermally conductive substrate was 1 mm.

The withstand voltages and thermal resistances of the thermally conductive substrate thus manufactured were measured if the clearance 103 between the radiation plate 102 and the end portion of the insulator sheet 101 was changed for each substrate.

Dielectric breakdown which occurs when a high voltage is applied to the lead frame 100 and the radiation plate 102 includes the dielectric breakdown of resin per se constituting the insulator sheet 101 and that on the creeping surface of the insulator sheet 101. The former withstand voltage is normally 15 kv/mm.

Since the present invention is mainly intended to extend an insulation distance on the creeping surface, it is necessary to estimate the effect of preventing the latter dielectric breakdown. For that reason, the measurement of withstand voltage breakdown measurement was carried out as follows. 20 thermally conductive substrate samples were manufactured and the rate of the samples having a withstand voltage of 15 kv/mm or less on the creeping surface of the insulator sheet 101 was calculated, thereby measuring the withstand voltage breakdown.

Further, the thermal resistance was measured as follows. Power was supplied to a power semiconductor package which was packaged on the lead frame 100 by a solder to generate heat, and the thermal resistance was obtained from the temperature difference between the semiconductor device and the radiation plate 102. Then, the average value of the thermal resistances of the respective samples measured under respective conditions was obtained.

The measurement results are shown in Table 1.

TABLE 1

| experiment No. | thickness of insulator sheet (μm) | distance of radiation plate from end portion of insulator sheet (μm) | rate of substrates having withstand voltage of 15 (kV/mm) or less on creeping surface (%) | thermal resistance (° C./W) |
| --- | --- | --- | --- | --- |
| 1a | 1000 | 0 | 90 | 1.36 |
| 1b | 1000 | 500 | 45 | 1.36 |
| 1c | 1000 | 750 | 20 | 1.36 |
| 1d | 1000 | 1000 | 0 | 1.36 |
| 1e | 1000 | 2000 | 0 | 1.36 |
| 1f | 1000 | 3000 | 0 | 1.36 |
| 1g | 1000 | 4000 | 0 | 1.36 |

TABLE 1-continued

| experiment No. | thickness of insulator sheet (μm) | distance of radiation plate from end portion of insulator sheet (μm) | rate of substrates having withstand voltage of 15 (kV/mm) or less on creeping surface (%) | thermal resistance (° C./W) |
| --- | --- | --- | --- | --- |
| 1h | 1000 | 5000 | 0 | 1.42 |
| 1i | 1000 | 6000 | 0 | 1.58 |

Further, thermally conductive substrates were manufactured while changing only the thickness of the insulator sheet 101 right under the lead frame to 0.8 mm. At the same time, the withstand voltages and thermal resistances of the samples were measured while changing the clearance 103 between the radiation plate 102 and the end portions of the insulator sheet 101 according to the samples in the same manner as stated above. The measurement results are shown in Table 2.

TABLE 2

| experiment No. | thickness of insulator sheet (μm) | distance of radiation plate from end portion of insulator sheet (μm) | rate of substrates having withstand voltage of 15 (kV/mm) or less on creeping surface (%) | thermal resistance (° C./W) |
| --- | --- | --- | --- | --- |
| 2a | 800 | 0 | 92 | 1.09 |
| 2b | 800 | 400 | 57 | 1.09 |
| 2c | 800 | 600 | 21 | 1.09 |
| 2d | 800 | 800 | 0 | 1.09 |
| 2e | 800 | 1600 | 0 | 1.09 |
| 2f | 800 | 2400 | 0 | 1.09 |
| 2g | 800 | 3200 | 0 | 1.10 |
| 2h | 800 | 4000 | 0 | 1.17 |
| 2i | 800 | 4800 | 0 | 1.34 |

Compared with comparison examples (Experiment Nos. 1a and 2a) in which the end portions of the radiation plate 102 were made coincident with the respective end portions of the insulator sheet, the thermally conductive substrates having the end portions of the radiation plate 102 arranged inside of the insulator sheet 101 with respect to the end portions of the insulator sheet 101 had improved withstand voltages on the creeping surfaces by as much as the respective clearances 103. If the clearance 103 was not less than one time of the thickness of the insulator sheet 101, in particular, the withstand voltage improvement effect was conspicuous, i.e., the withstand voltage was not less than 15 kv/mm which is considered to be the ordinary withstand voltage of the resin per se, and it is possible to ensure preventing dielectric breakdown on the creeping surface.

If the clearance 103 was not less than four times of the thickness of the insulator sheet 101, radiation from the radiation plate 102 was hampered and thermal resistance value increased. Accordingly, it was found that if the clearance 103 was one to four times as large as the thickness of the insulator sheet 101, the greatest effect was exhibited whereby dielectric breakdown on the creeping surface at the time of applying a high voltage to the thermally conductive substrate was prevented and a highly reliable thermally conductive substrate was obtained.

(Second Embodiment)

The second embodiment in which the end portions of the radiation plate 102 of the thermally conductive substrate manufactured in the same manner as that in the first embodiment were removed by a different method, will be described.

It is noted that the composition of the insulator sheet 101 used in this embodiment differs from that in the first embodiment. That is $Al_2O_3$ ("AM-28" (name used in trade) manufactured by Sumitomo Chemical Co., Ltd.) was used as the inorganic filler. A composition obtained by adding ethyl carbitol to phenol resin ("Phenolite, VH4150" (name used in trade) manufactured by DAINIPPON INK AND CHEMICALS, Inc.) was used as the thermosetting resin. The composition ratios of the respective components were as follows: 87 wt % of the inorganic filer, 11.5 wt % of the phenol resin and 1.5 wt % of the ethyl carbitol.

As in the case of the first embodiment, first, the lead frame 100, the (three) insulator sheets 101 and the radiation plate 102 made of an aluminum metallic plate were integrated with one another and thermosetting resin was completely hardened, thereby forming a thermally conductive substrate.

Next, using a dry film resist ("H-S930-30" (name used in trade) manufactured by Hitachi Chemical Co., Ltd.), etching resist films 106 were formed on the both surfaces of the thermally conductive substrate, respectively, by a roll lamination unit.

Then, a film mask (not shown) was arranged on a pattern to be finally left on the radiation plate 102-side etching resist film 106 and the etching resist films 106 on the both surfaces of the sheet 101 were subjected to an exposure treatment by an ultraviolet aligner.

Then, the thermally conductive substrate was treated in a developer and only the etching resist films 106 on the peripheral portions of the radiation plate 102 which were not subjected to the exposure treatment because of the film mask were selectively removed.

Moreover, by immersing the thermally conductive substrate in a 7% hydrochloric acid solution, the end portions of the radiation plate 102 not covered with the etching resist films 106 were removed. As a result, the thermally conductive substrate had a structure in which the radiation plate 102 was arranged inside of the insulator sheet 101 over the entire periphery of the end portions of the sheet 101. Finally, the etching resist films 106 were treated with sodium hydroxide and thereby removed.

If the clearance 103 of the thermally conductive substrate thus manufactured was set to be twice as large as the thickness of the insulator sheet 101, the withstand voltage measured 15 kv or higher or a good measurement value was obtained.

(Third Embodiment)

In this embodiment, the following insulator sheet 101 was used. $Al_2O_3$ (name used in trade: "AS-40" manufactured by SHOWA DENKO K. K.) was employed as the inorganic filler. A composition obtained by adding butyl carbitol and methyl ethyl ketone for regulating viscosity to cyanate ester resin (name used in trade: "AroCy M30" manufactured by Asahi-Ciba Co., Ltd.), was used as the thermosetting resin. The composition ratios of the respective components were as follows: 90 wt % of the inorganic filler, 9.5 wt % of the thermosetting resin and 0.5 wt % of the butyl carbitol.

As in the case of the first embodiment, the (three) insulator sheets 101, the lead frame 100 and the radiation plate 102 were superposed on one another, heated and pressurized at 150° C. and 50 $Kg/CM^2$ and, thereby obtaining the prototype of the thermally conductive substrate having the shape shown in FIG. 9B.

Then, the insulator sheets 101 were heated at a temperature of 175° C. for three hours by a dryer to thereby completely harden the thermosetting resin contained in the insulator sheets 101. Further, the outermost peripheral portions of the lead frame 100 were cut and portions of the lead frame 100 protruding from the insulator sheets 101 were bent perpendicularly, thereby using the tip ends of the lead frame 100 as external lead electrodes 105. As a result, the thermally conductive substrate shown in FIG. 8 was obtained. It is assumed that the thickness of the insulator sheet 101 right under the lead frame 100 of this thermally conductive substrate was 1 mm.

The withstand voltage and thermal resistance of the thermally conductive substrate thus manufactured were measured. The measurement results are that the withstand voltage was 15 kv/mm or higher and the thermal resistance was 1.36° C./W, thus confirming that a thermally conductive substrate capable of preventing dielectric breakdown on the creeping surface at the time of applying a high voltage to the substrate and ensuring high reliability was obtained.

In case of the thermally conductive substrate in each embodiment stated above, the creeping distance between the lead frame 100 and the radiation plate 102 can be easily extended and sufficient reliability against the dielectric breakdown at the time of applying a high voltage to the substrate can be maintained. Due to this, it is possible to locate the bent portions 105a of the lead frame 100 on the respective end portions of the insulator sheet 101 even if the lead frame 100 protruding to the side surfaces of the substrate is bending perpendicularly so as to use the tip ends of the frame 100 as external lead electrodes 105. It is, therefore, possible to widen a range in which components can be actually mounted on the substrate, relative to the size of the substrate. This signifies that it is possible to make the substrate size smaller than that of the conventional substrate.

Moreover, since the bent portions 105a of the lead frame 100 can be located on the respective end portions of the insulator sheet 101, it does not occur that the lead frame 100 embedded in the insulator sheet 101 is peeled off when bending the lead frame 100 to cause the damage of the substrate. This makes it unnecessary to provide steps on the end portions of the insulator sheet 101 so as to facilitate the bending of the lead frame 100 and to simplify the structure of a metallic mold used to manufacture the substrate accordingly, thereby realizing cost reduction.

As stated so far, the thermally conductive substrate and the thermally conductive substrate manufacturing method according to the present invention can contribute to making equipment small in size and cost reduction, as a substrate for power circuit which power increases further in the future.

While the present invention has been described with reference to the most preferred embodiments of the invention, various changes and modifications can be made to the combination and arrangement of the components in the preferred embodiments without departing from the spirit and scope of the invention to be claimed hereinafter.

What is claimed is:

1. A thermally conductive substrate comprising:
   an insulator sheet containing an inorganic filler;
   a lead frame embedded in one surface of the insulator sheet; and
   a radiation plate on the other surface of the insulator sheet;
   wherein, a part of the lead frame extends to an end portion of the insulator sheet, an end portion of the radiation plate is located on and near the end portion of the insulator sheet to which the lead frame extends, and the end portion of the radiation plate is provided at a position away from the end portion of the insulator sheet, adjacent to or embedded in the insulator sheet, in a plane direction of said insulator sheet.

2. A thermally conductive substrate according to claim 1, wherein the end portion of said radiation plate is provided at a position away from the end portion of said insulator sheet over an entire periphery of said radiation plate, inside of said insulator sheet in the plane direction of said insulator sheet.

3. A thermally conductive substrate according to claim 1, wherein a clearance between the end portion of the radiation plate located on and near the end portion of the insulator sheet, to which said lead frame extends, and the end portion of said insulator sheet is set to fall within a range of one to four times as large as a thickness of said insulator sheet.

4. A thermally conductive substrate according to claim 1, wherein said radiation plate is arranged to be embedded in said insulator sheet while a surface of said radiation plate is exposed from said insulator sheet.

5. A thermally conductive substrate according to claim 4, wherein at least a part of a side surface of said radiation plate in a thickness direction of said radiation plate is covered with said insulator sheet.

6. A thermally conductive substrate according to claim 1, wherein continuous steps along a direction crossing a shortest direction between said radiation plate and said lead frame are provided on the end portion of said insulator sheet, the end portion of the radiation plate arranged to be away from the end portion of said insulator sheet.

7. A thermally conductive substrate according to claim 1, wherein an external radiation structure is plane-bonded to an outer surface of said radiation plate, and at least a part of a region along a side surface of said radiation plate in a thickness direction of said radiation plate is exposed from said insulator sheet over an entire periphery of said radiation plate.

8. A thermally conductive substrate according to claim 1, wherein said insulator sheet contains an inorganic filler.

9. A power module comprising a thermally conductive substrate, an electronic component, a casing and sealing resin, wherein said thermally conductive substrate is constituted such that a lead frame is provided on one surface of an insulator sheet and a radiation plate is provide on the other surface of the insulator sheet, that a part of said lead frame extends to an end portion of said insulator sheet, and that an end portion of the radiation plate located on and near the end portion of the insulator sheet to which said lead frame extends, is provided at a position away from the end portion of said insulator sheet inside of said insulator sheet in a plane direction of said insulator sheet;

said electronic component is packaged on one surface of said thermally conductive substrate;

said casing is arranged to cover said thermally conductive substrate on which said electronic component is packaged; and said sealing resin is filled in an internal space of said casing and seals the internal space.

10. The thermally conductive substrate of claim 1, wherein the lead frame is embedded in the insulator sheet, and a surface of the lead frame and a surface of the insulator sheet are arranged on the same plane.

* * * * *